United States Patent
Masui et al.

(10) Patent No.: US 10,712,413 B2
(45) Date of Patent: Jul. 14, 2020

(54) POLYMER COMPOSITE MATERIAL FOR 1H DYNAMIC NUCLEAR POLARIZATION EXPERIMENTS AND METHOD FOR PRODUCING THE SAME, AND POLYMER COMPOSITE MATERIAL FOR 1H DYNAMIC NUCLEAR POLARIZATION CONTRAST VARIATION NEUTRON SCATTERING EXPERIMENTS

(71) Applicant: SUMITOMO RUBBER INDUSTRIES, LTD., Kobe-shi, Hyogo (JP)

(72) Inventors: Tomomi Masui, Kobe (JP); Yohei Nouda, Hitachi (JP); Satoshi Koizumi, Hitachi (JP)

(73) Assignee: SUMITOMO RUBBER INDUSTRIES, LTD., Kobe-Shi, Hyogo (JP)

( * ) Notice: Subject to any disclaimer, the term of this patent is extended or adjusted under 35 U.S.C. 154(b) by 106 days.

(21) Appl. No.: 15/729,255

(22) Filed: Oct. 10, 2017

(65) Prior Publication Data
US 2018/0113182 A1 Apr. 26, 2018

(30) Foreign Application Priority Data
Oct. 24, 2016 (JP) .................. 2016-207966

(51) Int. Cl.
| | |
|---|---|
| G01R 33/46 | (2006.01) |
| C08L 9/06 | (2006.01) |
| C08K 5/3435 | (2006.01) |
| C08J 7/02 | (2006.01) |
| G01N 24/10 | (2006.01) |

(Continued)

(52) U.S. Cl.
CPC .............. *G01R 33/46* (2013.01); *C08J 7/02* (2013.01); *C08K 3/04* (2013.01); *C08K 5/3435* (2013.01); *C08L 9/06* (2013.01); *C09C 1/48* (2013.01); *G01N 23/005* (2013.01); *G01N 24/10* (2013.01); *C08J 2309/00* (2013.01); *C08J 2309/06* (2013.01); *C08L 9/00* (2013.01); *C08L 23/06* (2013.01); *G01N 2223/05* (2013.01)

(58) Field of Classification Search
CPC ... G01R 33/46; C08J 7/02; C08K 3/04; C08K 5/3435; C08L 19/06; C08L 9/06; C09C 1/48; G01N 23/005; G01N 24/10
See application file for complete search history.

(56) References Cited

U.S. PATENT DOCUMENTS 3,873,489 A * 3/1975 Thurn .................... B82Y 30/00
524/262

FOREIGN PATENT DOCUMENTS

JP 2016-008850 * 1/2016 ............. G01R 33/28

OTHER PUBLICATIONS

Machine translation of JP 2016-008850. (Year: 2016).*
(Continued)

*Primary Examiner* — John E Uselding
(74) *Attorney, Agent, or Firm* — Birch, Stewart, Kolasch & Birch, LLP

(57) ABSTRACT

Provided is a polymer composite material which has a high proton spin polarization even though it is a polymer composite material containing carbon black. The present invention relates to a polymer composite material for $^1$H dynamic nuclear polarization experiments, containing carbon black, having a thickness of 0.8 mm or less, and being doped with a paramagnetic radical compound.

7 Claims, 1 Drawing Sheet

(51) Int. Cl.
*C08K 3/04* (2006.01)
*C09C 1/48* (2006.01)
*G01N 23/00* (2006.01)
*C08L 9/00* (2006.01)
*C08L 23/06* (2006.01)

(56) References Cited

OTHER PUBLICATIONS

Yohei et al. Spin contrast variation study of fuel-efficient tire rubber. Physics Procedia 42 (2013) 52-27 (Year: 2013).*

Bunyatova E.I. Free radicals and polarized targets. Nuclear Instruments and Methods in Physics Research A 526 (2004) 22-27 (Year: 2004).*

Koga et al. Structure Factors of Dispersible Units of Carbon Black Filler in Rubbers. Langmuir 2005, 21, 11409-11413. (Year: 2005).*

Harper et al. Use of Fillers to Enable the Microwave Processing of Polyethylene. Journal of Microwave Power and Electromagnetic Energy, 40:4, 219-227; Jun. 14, 2016 (Year: 2016).*

Yohei et al. Contrast variation by dynamic nuclear polarization and time-of-flight small-angle neutron scattering. I. Application to industrial multi-component nanocomposites. J Appl Crystallogr Dec. 1, 2016; 49 (Pt 6): 2036-2045. Published online Nov. 8, 2016. (Year: 2016).*

Bunyatova, "Free Radicals and Polarized Targets," Nuclear Instruments and Methods in Physics Research A, vol. 526, 2004, pp. 22-27.

Kumada et al., "Dynamic Nuclear Polarization of High- and Low-crystallinity Polyethylenes," Nuclear Instruments and Methods in Physics Research A, vol. 606, 2009 (Available online May 7, 2009), pp. 669-674.

Kumada et al., "Dynamic Nuclear Polarization System for the SANS-J-II Spectrometer at JAEA," Physica B, vol. 404, 2009, pp. 2637-2639.

Kumada et al., "Mesoscale Spatial Distribution of Electron Spins Studied by Time-resolved Small-angle and Ultrasmall-angle Neutron Scattering with Dynamic Nuclear Polarization . . . ," The Journal of Chemical Physics, vol. 133, 2010 (Published online Aug. 3, 2010), pp. 054504-1 to 054504-7 (Total 8 pages).

Noda et al., "Inhomogeneous Dynamic Nuclear Polarization of Protons in a Lamella-forming Diblock Copolymer Investigated by a Small-angle Neutron Scattering Method," Journal of Applied Crystallography, vol. 44, 2011, pp. 503-513.

Noda et al., "PNCMI 2012—Polarized Neutrons for Condensed Matter Investigations 2012, Spin Contrast Variation Study of Fuel-efficient Tire Rubber," Physics Procedia, vol. 42, 2013, pp. 52-57.

Noda et al., "Small-angle Neutron Scattering Study of Dynamically Polarized Polyethylenes," Physica B, vol. 404, 2009, pp. 2572-2574.

Takenaka et al., "Structure Analyses of Swollen Rubber-Filler Systems by Using Contrast Variation SANS," Macromolecues, vol. 42, No. 1, 2009 (Published on Web Dec. 16, 2008), pp. 308-311.

\* cited by examiner

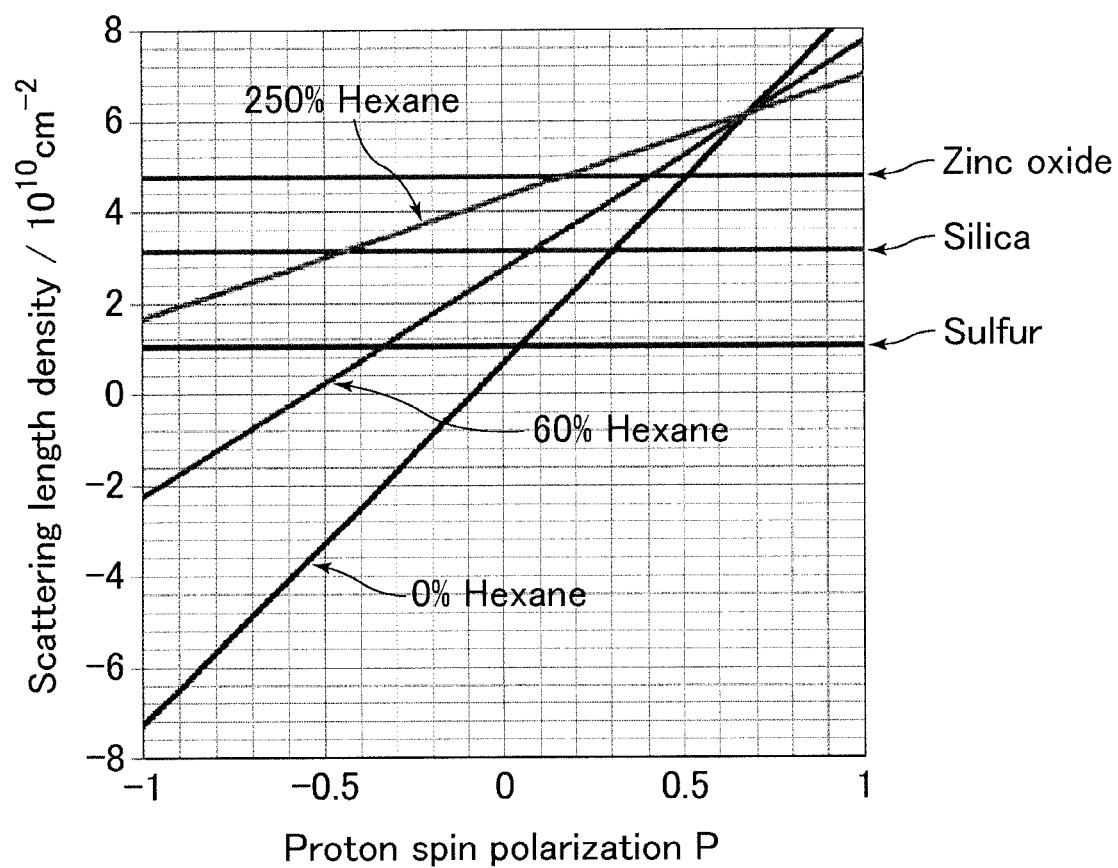

POLYMER COMPOSITE MATERIAL FOR 1H DYNAMIC NUCLEAR POLARIZATION EXPERIMENTS AND METHOD FOR PRODUCING THE SAME, AND POLYMER COMPOSITE MATERIAL FOR 1H DYNAMIC NUCLEAR POLARIZATION CONTRAST VARIATION NEUTRON SCATTERING EXPERIMENTS

TECHNICAL FIELD

A first aspect of the present invention relates to a polymer composite material that can be applied to $^1$H dynamic nuclear polarization, and a method for producing the same.

A second aspect of the present invention relates to a polymer composite material that can be applied to $^1$H dynamic nuclear polarization contrast variation neutron scattering.

BACKGROUND ART

Background Art of First Aspect of Present Invention

Nuclear spin polarization is the degree to which the nuclear spin is aligned with a given direction in a sample. Nuclear spin polarization has an advantage in that it can be used to control contrast in neutron scattering and to enhance detection sensitivity in NMR.

In dynamic nuclear polarization, electron spins having a large magnetic moment that is at least several hundred times that of a nuclear spin is introduced into a sample, and then the electron spins are polarized at a low temperature under a high magnetic field, followed by transfer of polarization from the electron spins to the nuclear spins by microwave irradiation, thereby achieving high polarization of the nuclear spins. To this end, it is necessary to introduce a radical serving as an electron spin source into the sample. It has been reported that samples in which a stable vaporized radical compound is diffused into a pure polymer material such as polyethylene have good proton spin polarization (Non Patent Literatures 1 to 6).

However, only one example (Non Patent Literature 7) has been reported in which dynamic nuclear polarization is applied to polymer composite materials in which various functionalizing fillers are introduced into a polymer material as a medium, and the proton spin polarization in these cases is very low (at most 20%). Moreover, the polymer composite materials used in this example are ones containing silica fine particles, and there has been no reported success in the polarization of polymer composite materials containing carbon black.

Background Art of Second Aspect of Present Invention

Solvent contrast variation neutron scattering is a dominant technique for the structural analysis of multicomponent systems such as polymer composite materials (Non Patent Literature 8). This technique utilizes the difference in contrast between protium and deuterium, which is the peculiar nature of neutron scattering, and involves swelling a polymer composite material in a mixture of a protium solvent and a deuterium solvent in varied ratios, and making neutron scattering measurements on each sample, whereby structural analysis can be performed on the multicomponent system.

In recent years, there has also been reported a method in which a structural analysis of a multicomponent system is performed using a technique called $^1$H dynamic nuclear polarization contrast variation neutron scattering (Non Patent Literatures 1 to 6). In this technique, a paramagnetic radical is introduced into a material, which is then irradiated with microwaves under an applied magnetic field to polarize the proton spins in the material. Thus, the contrast can be changed, allowing structural analysis to be performed on multicomponent systems.

However, the solvent contrast variation neutron scattering technique requires solvent swelling of samples to perform structural analysis on the samples, and it is difficult to perform structural analysis on non-swollen samples. In the $^1$H dynamic nuclear polarization contrast variation neutron scattering technique, on the other hand, samples can be analyzed without solvent swelling. However, this technique requires high proton spin polarization to determine the structures of the components in a polymer composite material. While the maximum proton spin polarization of polymer composite materials currently reaches 60%, it is technically difficult to ensure 60%, and therefore it is difficult to perform structural analysis on multicomponent systems.

CITATION LIST

Non Patent Literature

Non Patent Literature 1: Nucl. Inst. Meth. A 526, 22-27 (2004)
Non Patent Literature 2: Physica B 404 2572-2574 (2009)
Non Patent Literature 3: Physica B 404 2637-2639 (2009)
Non Patent Literature 4: Nucl. Inst. Meth. A 606, 669-674 (2009)
Non Patent Literature 5: J. Chem. Phys 133, 054504 (2010)
Non Patent Literature 6: J. Appl. Cryst. 44. 503-513 (2011)
Non Patent Literature 7: Physics Procedia 42, 52-57 (2013)
Non Patent Literature 8: Macromolecules, 42, 308-311 (2009)

SUMMARY OF INVENTION

Technical Problem

An object of the first aspect of the present invention is to provide a polymer composite material which has a high proton spin polarization even though it is a polymer composite material containing carbon black.

An object of the second aspect of the present invention is to provide a polymer composite material on which accurate structural analysis can be performed by $^1$H dynamic nuclear polarization contrast variation neutron scattering even when the proton spin polarization is less than 60%.

Solution to Problem

First Aspect of Present Invention

As a result of extensive research, the present inventors have found that $^1$H dynamic nuclear polarization of polymer composite materials containing carbon black cannot be adequately accomplished, and have further found that the reason why such $^1$H dynamic nuclear polarization cannot be adequately accomplished is due to the temperature increase during microwave irradiation, and such a temperature increase is caused by the incorporation of carbon black. Moreover, the present inventors have found, as a result of extensive research, that by forming a polymer composite material containing carbon black into a thin film, the temperature increase can be prevented so that a high proton spin polarization can be achieved. Thus, the inventors have arrived at the first aspect of the present invention.

Specifically, the first aspect of the present invention relates to a polymer composite material for $^1$H dynamic nuclear polarization experiments, containing carbon black, having a thickness of 0.8 mm or less, and being doped with a paramagnetic radical compound.

The polymer composite material for $^1$H dynamic nuclear polarization experiments preferably has a local concentration of the paramagnetic radical compound that is substantially not position-dependent.

The polymer composite material for $^1$H dynamic nuclear polarization experiments preferably contains substantially no molecular oxygen.

The polymer composite material for $^1$H dynamic nuclear polarization experiments preferably has a local concentration of the paramagnetic radical compound of 15 to 35 mM.

The polymer composite material for $^1$H dynamic nuclear polarization experiments preferably has a proton spin polarization of 25% or more.

The polymer composite material for $^1$H dynamic nuclear polarization experiments is preferably prepared by a production method including the step of diffusing a paramagnetic radical compound into a polymer composite material in the presence of an inert gas, a polymer composite material under vacuum, or a polymer composite material immersed in a solvent.

The first aspect of the present invention also relates to a method for producing the polymer composite material for $^1$H dynamic nuclear polarization experiments, the method including the step of diffusing a paramagnetic radical compound into a polymer composite material in the presence of an inert gas, a polymer composite material under vacuum, or a polymer composite material immersed in a solvent.

Second Aspect of Present Invention

In order to perform structural analysis on a polymer composite material as a multicomponent system by neutron scattering, it is necessary to match the contrast of the matrix polymer in the polymer composite material with the contrast of the other components.

As a result of extensive research, the present inventors have found that when a deuterated solvent necessary for solvent contrast variation is introduced into a polymer composite material to such an extent that the structure of the polymer composite material is not greatly changed, and further a paramagnetic radical compound necessary for $^1$H dynamic nuclear polarization contrast variation is introduced thereinto, it is possible to match the contrast of the matrix polymer in the polymer composite material with the contrast of the other components, thereby allowing an accurate structural analysis of the polymer composite material to be achieved by $^1$H dynamic nuclear polarization contrast variation neutron scattering, even when the proton spin polarization is less than 60%. Thus, the inventors have arrived at the second aspect of the present invention.

Specifically, the second aspect of the present invention relates to a polymer composite material for $^1$H dynamic nuclear polarization contrast variation neutron scattering experiments, wherein a paramagnetic radical compound and a deuterated solvent are introduced, the deuterated solvent is present in an amount of 0.5 to 200% of the polymer, and a local concentration of the paramagnetic radical compound is 10 to 50 mM.

The polymer composite material for $^1$H dynamic nuclear polarization contrast variation neutron scattering experiments preferably contains substantially no molecular oxygen.

The polymer composite material for $^1$H dynamic nuclear polarization contrast variation neutron scattering experiments preferably has a local concentration of the paramagnetic radical compound that is substantially not position-dependent.

Advantageous Effects of Invention

The first aspect of the present invention relates to a polymer composite material for $^1$H dynamic nuclear polarization experiments, which is doped with a paramagnetic radical compound, and which contains carbon black and has a thickness of 0.8 mm or less. It is thus possible to provide a polymer composite material which has a high proton spin polarization even though it contains carbon black. Moreover, experiments of neutron scattering in high contrast conditions and high sensitivity NMR experiments require materials having a high proton spin polarization; however, with the material of the present invention, in spite of the incorporation of carbon black, such high contrast experiments can be made, and the accuracy of experimental data is improved, and thus it is possible to determine the structure of a multicomponent system.

The second aspect of the present invention relates to a polymer composite material for $^1$H dynamic nuclear polarization contrast variation neutron scattering experiments, wherein a paramagnetic radical compound and a deuterated solvent are introduced, the deuterated solvent is present in an amount of 0.5 to 200% of the polymer, and the local concentration of the paramagnetic radical compound is 10 to 50 mM. Accurate structural analysis can be performed on such a polymer composite material by $^1$H dynamic nuclear polarization contrast variation neutron scattering even when the proton spin polarization is less than 60%.

BRIEF DESCRIPTION OF DRAWINGS

The FIGURE is a graph representing the results of $^1$H dynamic nuclear polarization solvent contrast variation neutron scattering experiments of Example and Comparative Examples according to the second aspect of the present invention.

DESCRIPTION OF EMBODIMENTS

First Aspect of Present Invention

The polymer composite material for $^1$H dynamic nuclear polarization experiments of the first aspect of the present invention is obtained by diffusing a paramagnetic radical compound (or doping with a paramagnetic radical compound). Further, it contains carbon black, and has a thickness of 0.8 mm or less.

The term "polymer composite material" refers to a material (composition) in which any type of additive is incorporated into a polymer material.

Non-limiting examples of the polymer material include diene rubbers such as natural rubber (NR), polyisoprene rubber (IR), polybutadiene rubber (BR), styrene-butadiene rubber (SBR), styrene-isoprene-butadiene rubber (SIBR), ethylene-propylene-diene rubber (EPDM), chloroprene rubber (CR), acrylonitrile-butadiene rubber (NBR), and butyl rubber (IIR). Among them, diene rubbers are preferred, with styrene-butadiene rubber being more preferred. These polymer materials may be used alone or in combinations of two or more.

Examples of additives include fillers such as silica and carbon black, zinc oxide, and vulcanizing agents such as sulfur. The amount of additives is not particularly limited, but the amount of fillers is preferably 5 to 150 parts by mass, more preferably 10 to 100 parts by mass per 100 parts by mass of the polymer material.

The polymer composite material of the first aspect of the present invention contains carbon black as a filler. Suitable examples of the carbon black include, but are not limited to, SAF, ISAF, and HAF.

The nitrogen adsorption specific surface area ($N_2SA$) of the carbon black is preferably 60 $m^2/g$ or more, more preferably 80 $m^2/g$ or more, but preferably 200 $m^2/g$ or less, more preferably 150 $m^2/g$ or less. When the $N_2SA$ of the carbon black falls within the range indicated above, the effect of the present invention can be more suitably achieved.

Herein, the $N_2SA$ of the carbon black is determined according to JIS K 6217-2:2001.

The amount of carbon black is preferably 5 to 100 parts by mass, more preferably 10 to 40 parts by mass per 100 parts by mass of the polymer material. When the amount of carbon black falls within the range indicated above, the effect of the present invention can be more suitably achieved.

The thickness of the polymer composite material is 0.8 mm or less, preferably 0.7 mm or less, more preferably 0.6 mm or less, further preferably 0.5 mm or less. When the thickness is 0.8 mm or less, the temperature increase during microwave irradiation in dynamic nuclear polarization experiments can be prevented. The lower limit of the thickness is not particularly limited, but lower thickness is more preferred.

Examples of the paramagnetic radical compound to be diffused into the polymer composite material include, but are not limited to, 2,2,6,6-tetramethylpiperidine 1-oxyl (TEMPO), 4-oxo-2,2,6,6-tetramethylpiperidine N-oxyl (TEMPONE), 1-oxyl-2,2,6,6-tetramethyl-4-hydroxypiperidine (TEMPOL), and trityl radical. Among them, 2,2,6,6-tetramethylpiperidine 1-oxyl (TEMPO) is preferred.

As has been known heretofore, for efficient $^1H$ dynamic nuclear polarization, electron spins are required to be uniformly distributed at an appropriate concentration, and the optimal concentration in experiments directed to pure polymer materials is 30 mM. In polymer composite materials, however, no radical can penetrate into fillers such as silica and carbon black, and therefore the distance between radicals is shorter than that expected from the net radical concentration measured by ESR (electron spin resonance) spectroscopy. In view of this problem, the local concentration of the paramagnetic radical compound is defined by the following expression.

(Local concentration of paramagnetic radical compound)=(Concentration of paramagnetic radical compound)/(1−(Volume fraction of filler))

The local concentration of the paramagnetic radical compound in the polymer composite material is preferably 15 mM or more, more preferably 20 mM or more. The local concentration is also preferably 35 mM or less, more preferably 30 mM or less. When it is more than 35 mM, the depolarization rate tends to increase, resulting in lower polarization.

The polymer composite material preferably has a local concentration of the paramagnetic radical compound that is substantially not position-dependent. That is, in the polymer composite material, the local concentration of the paramagnetic radical compound is preferably substantially uniform. Specifically, when the local concentration of the paramagnetic radical compound is measured at 10 points per polymer composite material, the difference between the local concentrations of the paramagnetic radical compound in a region with the highest local concentration and in a region with the lowest local concentration is preferably 1 mM or less, more preferably 0.5 mM or less, further preferably 0.1 mM or less, particularly preferably 0.05 mM or less.

The proton spin polarization of the polymer composite material is preferably 25% or more, more preferably 30% or more, further preferably 35% or more. When it is less than 25%, it tends to be difficult to analyze its experimental data.

The proton spin polarization of the polymer composite material is defined by the following expression, and can be measured as described in EXAMPLES.

(Proton spin polarization)=(Number of up-spins−Number of down-spins)/(Number of up-spins+Number of down-spins)

The polymer composite material preferably contains substantially no molecular oxygen. The polymer composite material containing substantially no molecular oxygen can be suitably produced by doping a polymer composite material with a paramagnetic radical compound in conditions where no oxygen is present, as described later.

$^1H$ dynamic nuclear polarization is a technique which can be combined with neutron scattering or NMR to improve contrast and sensitivity in either technique. It can be used to determine the dispersion of fillers such as carbon black, zinc, sulfur, and other components in a multicomponent system such as a rubber composition.

The polymer composite material for $^1H$ dynamic nuclear polarization experiments of the first aspect of the present invention can be produced by a method in which a polymer composite material is prepared, such as by kneading a polymer material with additives such as carbon black in a kneading apparatus such as a Banbury mixer, a kneader, or an open roll mill, followed by a crosslinking reaction (vulcanization), and then a paramagnetic radical compound is diffused into the polymer composite material to dope the polymer composite material with the paramagnetic radical compound.

In particular, the method preferably includes the step of diffusing a paramagnetic radical compound into a polymer composite material in the presence of an inert gas, or under vacuum, or while immersing the polymer composite material in a solvent. This removes any molecular oxygen present in the polymer composite material, so that the distance between radicals in the polymer composite material can be optimized, thus providing a polymer composite material having a higher proton spin polarization than in the prior art. That is, a polymer composite material containing substantially no molecular oxygen can be suitably produced by doping a polymer composite material with a paramagnetic radical compound in conditions where no oxygen is present. In the thus produced polymer composite material which contains substantially no molecular oxygen, the local concentration of the paramagnetic radical compound is substantially not position-dependent. Thus, it is possible to provide a polymer composite material having a higher proton spin polarization than in the prior art.

More specifically, the method of diffusing a paramagnetic radical compound into a polymer composite material in the presence of an inert gas, or under vacuum, or while immersing the polymer composite material in a solvent may include, but is not limited to, diffusing a paramagnetic radical compound into a polymer composite material in a deoxygenated environment (in the presence of an inert gas, under vacuum, or in a solvent), such as in a glove box (for example, a glove box where the molecular oxygen concentration is 1 ppm or less), or in an environment where oxygen has been removed by a deoxygenating agent.

Examples of the inert gas include nitrogen, argon and helium. Examples of the solvent include toluene, tetrahydrofuran, benzene, methacrylic acid, methyl methacrylate, butyl methacrylate, styrene, and xylene.

The diffusion of a paramagnetic radical compound may be carried out by any method, such as by vapor infiltration with the paramagnetic radical compound, or immersion into a solution of the paramagnetic radical compound. The vapor infiltration may be carried out, for example, by standing under deoxygenated conditions at 20 to 60° C. for 3 to 14 days, preferably 5 to 14 days. With such standing for a long time, it is possible to more suitably provide a polymer composite material in which the local concentration of the paramagnetic radical compound is substantially not position-dependent and thus which has a higher proton spin polarization than in the prior art.

Second Aspect of Present Invention

In the polymer composite material for $^1$H dynamic nuclear polarization contrast variation neutron scattering experiments of the second aspect of the present invention, a paramagnetic radical compound and a deuterated solvent have been introduced into the polymer composite material, the deuterated solvent is present in an amount of 0.5 to 200% of the polymer, and the local concentration of the paramagnetic radical compound is 10 to 50 mM.

Examples and suitable embodiments of the polymer material and additives used in the polymer composite material, and the paramagnetic radical compound introduced into (or used to dope) the polymer composite material are as described for the first aspect of the present invention.

The local concentration of the paramagnetic radical compound in the polymer composite material is 10 to 50 mM, preferably 20 to 40 mM. If the local concentration is outside the range indicated above, good proton spin polarization tends not to be obtained.

The local concentration is defined in the same manner as in the first aspect of the present invention.

Examples of the deuterated solvent include deuterated hexane, deuterated chloroform, and deuterated methanol. Among them, deuterated hexane is preferred.

The amount of the deuterated solvent is 0.5 to 200%, preferably 10 to 100% of the polymer (matrix polymer) in the polymer composite material. If the amount of the deuterated solvent is outside the range indicated above, it may be impossible to match the contrast of the matrix polymer in the polymer composite material with the contrast of the other components.

The polymer composite material preferably has a local concentration of the paramagnetic radical compound that is substantially not position-dependent. That is, in the polymer composite material, the local concentration of the paramagnetic radical compound is preferably substantially uniform.

Specifically, when the local concentration of the paramagnetic radical compound is measured at 10 points per polymer composite material, the difference between the local concentrations of the paramagnetic radical compound in a region with the highest local concentration and in a region with the lowest local concentration is preferably 1 mM or less, more preferably 0.5 mM or less, further preferably 0.1 mM or less, particularly preferably 0.05 mM or less.

The polymer composite material preferably contains substantially no molecular oxygen. The polymer composite material containing substantially no molecular oxygen can be suitably produced by introducing (diffusing) a paramagnetic radical compound and a deuterated solvent into a polymer composite material in conditions where no oxygen is present.

The polymer composite material for $^1$H dynamic nuclear polarization contrast variation neutron scattering experiments of the second aspect of the present invention can be produced as described for the first aspect of the present invention.

EXAMPLES

Example According to First Aspect of Present Invention

The first aspect of the present invention is specifically described with reference to examples, but the first aspect of the present invention is not intended to be limited only to these examples.

Preparation Example

Used were 100 parts by mass of SBR (SBR NS116R available from Zeon Corporation), 20 parts by mass of carbon black (N220 ($N_2$SA: 112 m$^2$/g) available from Cabot Japan K.K.), 3 parts by mass of stearic acid (stearic acid available from NOF Corporation), 2 parts by mass of zinc oxide (zinc oxide #1 available from Mitsui Mining & Smelting Co., Ltd.), 2 parts by mass of sulfur (powdered sulfur available from Tsurumi Chemical Industry Co., Ltd.), 1 part by mass of vulcanization accelerator NS (Nocceler NS (chemical name: N-tert-butyl-2-benzothiazylsulfenamide) available from Ouchi Shinko Chemical Industrial Co., Ltd.), and 1 part by mass of vulcanization accelerator D (Nocceler D (chemical name: 1,3-diphenylguanidine) available from Ouchi Shinko Chemical Industrial Co., Ltd.).

The compounding components other than the sulfur and vulcanization accelerators were kneaded in a 1.7 L internal Banbury mixer for 3 to 5 minutes until the temperature reached 150° C., to obtain a base-kneaded compound. Next, the base-kneaded compound was kneaded with the sulfur and vulcanization accelerators in an open roll mill, and the resulting kneaded mixture was vulcanized to obtain a polymer composite material.

Example 1-1 and Comparative Examples 1-1 to 1-5

The polymer composite material prepared in Preparation Example was sliced to different thicknesses, and each slice was then cut to a size of 15 mm×15 mm and allowed to stand in the presence of a paramagnetic radical compound (TEMPO (chemical name: 2,2,6,6-tetramethylpiperidine 1-oxyl free radical) available from Tokyo Chemical Industry Co., Ltd.) under deoxygenated conditions (in an argon atmosphere) at 40° C. for 1 week to vapor infiltrate the polymer composite material with TEMPO, thereby obtaining polymer composite materials for $^1$H dynamic nuclear polarization experiments. The polymer composite materials were subjected to dynamic nuclear polarization experiments under deoxygenated conditions (in a helium atmosphere).

In Example 1-1, the polymer composite material used was one containing carbon black and having a TEMPO concentration (local concentration of the paramagnetic radical compound) of 23.5 mM and a thickness of 0.5 mm (the difference in local concentration: 0.02 mM), and dynamic nuclear polarization experiments were carried out under deoxygenated conditions.

In Comparative Example 1-1, the polymer composite material used was one containing carbon black and having a TEMPO concentration (local concentration of the paramagnetic radical compound) of 23.5 mM and a thickness of 1.0 mm (the difference in local concentration: 0.02 mM), and dynamic nuclear polarization experiments were carried out under deoxygenated conditions.

In Comparative Example 1-2, the polymer composite material used was one containing carbon black and having a TEMPO concentration (local concentration of the paramagnetic radical compound) at the center of the material of 20 mM, a TEMPO concentration at the periphery of the material of 30 mM, and a thickness of 1.0 mm (the difference in local concentration: 10 mM), and dynamic nuclear polarization experiments were carried out under deoxygenated conditions.

In Comparative Example 1-3, the polymer composite material used was one containing carbon black and having a TEMPO concentration (local concentration of the paramagnetic radical compound) of 23.5 mM and a thickness of 1.0 mm (the difference in local concentration: 0.02 mM), and dynamic nuclear polarization experiments were carried out under deoxygenated conditions after the material was exposed to air.

In Comparative Examples 1-4 and 1-5, the polymer composite materials used were ones containing carbon black and having TEMPO concentrations (local concentrations of the paramagnetic radical compound) of 5 mM and 40 mM, respectively, and a thickness of 1.0 mm (the differences in the local concentration: 0.02 mM and 0.03 mM, respectively), and dynamic nuclear polarization experiments were carried out under deoxygenated conditions.

(Measurement of Radical Concentration in Polymer Composite Material)

The polymer composite materials were cut out, and the radical concentration in the polymer composite material sections was quantified by ESR spectroscopy. The ESR spectroscopy was conducted using ELEXSYS E500 manufactured by BRUKER. Manganese as a standard substance was simultaneously measured for intensity correction to quantify the amount of radicals.

(Dynamic Nuclear Polarization)

Through theoretical derivation, when the proton spin polarization is measured under thermal equilibrium conditions at a temperature of 4.2 [K] and a magnetic field strength of 3.34 [Tesla], the proton spin polarization is 0.0816%. Accordingly, the peak area of an NMR signal in this conditions was used as a reference, and the proton spin polarization was estimated from the rate of increase in the peak area of the NMR signal at a temperature of 1.2 [K] and a magnetic field strength of 3.35 [Tesla] under microwave irradiation (frequency: 94 [GHz], intensity: 0.5 [W]).

TABLE 1

| | Example | Comparative Example | | | | |
|---|---|---|---|---|---|---|
| | 1-1 | 1-1 | 1-2 | 1-3 | 1-4 | 1-5 |
| Thickness (mm) | 0.5 | 1.0 | 1.0 | 1.0 | 1.0 | 1.0 |
| Proton spin polarization (%) | 36 | 15 | 10 | 8 | 12 | 14 |

In Comparative Examples 1-1 to 1-5 where the thickness of the polymer composite material for $^1$H dynamic nuclear polarization experiments was high, the proton spin polarization was low. In Comparative Example 1-2 where the radical concentration in the material was non-uniform, the proton spin polarization was further reduced. In Comparative Example 1-3 where the material was exposed to air, the proton spin polarization was further reduced. In Comparative Example 1-4 where the local concentration of the paramagnetic radical compound in the material was too low, the proton spin polarization was further reduced. In Comparative Example 1-5 where the local concentration of the paramagnetic radical compound in the material was too high, the proton spin polarization was further reduced. In contrast, in Example 1 where the thickness was 0.8 mm or less, the proton spin polarization was very high (36%).

Example According to Second Aspect of Present Invention

The second aspect of the present invention is specifically described with reference to examples, but the second aspect of the present invention is not intended to be limited only to these examples.

Preparation Example

Used were 100 parts by mass of SBR (SBR NS116R available from Zeon Corporation), 56.8 parts by mass of silica (Ultrasil VN3 available from Evonik), 3 parts by mass of stearic acid (stearic acid available from NOF Corporation), 2 parts by mass of zinc oxide (zinc oxide #1 available from Mitsui Mining & Smelting Co., Ltd.), 4.5 parts by mass of a silane coupling agent (Si69 (bis(3-triethoxysilylpropyl) tetrasulfide) available from Degussa), 2 parts by mass of sulfur (powdered sulfur available from Tsurumi Chemical Industry Co., Ltd.), 1 part by mass of vulcanization accelerator NS (Nocceler NS (chemical name: N-tert-butyl-2-benzothiazylsulfenamide) available from Ouchi Shinko Chemical Industrial Co., Ltd.), and 1 part by mass of vulcanization accelerator D (Nocceler D (chemical name: 1,3-diphenylguanidine) available from Ouchi Shinko Chemical Industrial Co., Ltd.).

The compounding components other than the sulfur and vulcanization accelerators were kneaded in a 1.7 L internal Banbury mixer for 3 to 5 minutes until the temperature reached 150° C., to obtain a base-kneaded compound. Next, the base-kneaded compound was kneaded with the sulfur and vulcanization accelerators in an open roll mill, and the resulting kneaded mixture was vulcanized to obtain a polymer composite material.

Example 2-1 and Comparative Examples 2-1 to 2-4

The polymer composite material prepared in Preparation Example was sliced to a thickness of 1 mm, and each slice was cut to a size of 15 mm×15 mm and allowed to stand in the presence of a paramagnetic radical compound (TEMPO (chemical name: 2,2,6,6-tetramethylpiperidine 1-oxyl free radical) available from Tokyo Chemical Industry Co., Ltd.) and deuterated hexane (available from Kanto Chemical Co., Inc.) under deoxygenated conditions (in an argon atmosphere) at 40° C. for 1 week to vapor infiltrate the polymer composite material with TEMPO and deuterated hexane, thereby obtaining polymer composite materials for $^1$H dynamic nuclear polarization solvent contrast variation neutron scattering experiments. The polymer composite materials were subjected to $^1$H dynamic nuclear polarization solvent contrast variation neutron scattering experiments under deoxygenated conditions (in a helium atmosphere).

In Example 2-1, the polymer composite material used was one having a TEMPO concentration (local concentration of the paramagnetic radical compound) of 30 mM and containing 60% (relative to the matrix polymer) deuterated hexane (the difference in local concentration: 0 mM), and $^1$H dynamic nuclear polarization solvent contrast variation neutron scattering experiments were carried out under deoxygenated conditions.

In Comparative Example 2-1, the polymer composite material used was one having a TEMPO concentration (local concentration of the paramagnetic radical compound) of 30 mM and containing 0% (relative to the matrix polymer) deuterated hexane (the difference in local concentration: 0 mM), and $^1$H dynamic nuclear polarization solvent contrast variation neutron scattering experiments were carried out under deoxygenated conditions.

In Comparative Example 2-2, the polymer composite material used was one having a TEMPO concentration (local concentration of the paramagnetic radical compound) of 30 mM and containing 250% (relative to the matrix polymer) deuterated hexane (the difference in local concentration: 0 mM), and $^1$H dynamic nuclear polarization solvent contrast variation neutron scattering experiments were carried out under deoxygenated conditions.

In Comparative Example 2-3, the polymer composite material used was one having a TEMPO concentration (local concentration of the paramagnetic radical compound) of 3 mM and containing 60% (relative to the matrix polymer) deuterated hexane (the difference in local concentration: 0 mM), and $^1$H dynamic nuclear polarization solvent contrast variation neutron scattering experiments were carried out under deoxygenated conditions.

In Comparative Example 2-4, the polymer composite material used was one having a TEMPO concentration (local concentration of the paramagnetic radical compound) of 60 mM and containing 60% (relative to the matrix polymer) deuterated hexane (the difference in local concentration: 0 mM), and $^1$H dynamic nuclear polarization solvent contrast variation neutron scattering experiments were carried out under deoxygenated conditions.

(Measurement of Radical Concentration in Polymer Composite Material)

The polymer composite materials were cut out, and the radical concentration in the polymer composite material sections was quantified by ESR spectroscopy. The ESR spectroscopy was conducted using ELEXSYS E500 manufactured by BRUKER. Manganese as a standard substance was simultaneously measured for intensity correction to quantify the amount of radicals.

($^1$H Dynamic Nuclear Polarization)

Through theoretical derivation, when the proton spin polarization is measured under thermal equilibrium conditions at a temperature of 4.2 [K] and a magnetic field strength of 3.34 [Tesla], the proton spin polarization is 0.0816%. Accordingly, the peak area of an NMR signal in this conditions was used as a reference, and the proton spin polarization was estimated from the rate of increase in the peak area of the NMR signal at a temperature of 1.2 [K] and a magnetic field strength of 3.35 [Tesla] under microwave irradiation (frequency: 94 [GHz], intensity: 0.5 [W]).

(Experimental Results)

As illustrated in the FIGURE, in Example 2-1 (60% Hexane in the FIGURE), the proton spin polarization was ±0.4, but the contrast matched those of zinc oxide, silica, and sulfur in the polymer composite material used as a sample, and thus it was possible to characterize the respective structures.

In Comparative Example 2-1 (0% Hexane in the FIGURE), the proton spin polarization was ±0.4 as in Example 2-1, but the contrast did not match that of zinc oxide in the polymer composite material, and thus it was impossible to characterize the respective structures.

In Comparative Example 2-2 (250% Hexane in the FIGURE), the proton spin polarization was ±0.4 as in Example 2-1, but the polymer composite material swelled so that its size was increased, and thus it was impossible to perform structural analysis on the material in the non-swollen state. In addition, the contrast matched that of zinc oxide in the polymer composite material, but did not match those of silica and sulfur, and thus it was impossible to characterize the respective structures.

In Comparative Example 2-3, the proton spin polarization was not sufficiently increased, and thus it was impossible to perform structural analysis.

In Comparative Example 2-4, the proton spin polarization was not sufficiently increased, and thus it was impossible to perform structural analysis.

The invention claimed is:

1. A polymer composite material for $^1$H dynamic nuclear polarization experiments, comprising
    carbon black,
    wherein the polymer composite material has a thickness of 0.5 mm or less, and is doped with a paramagnetic radical compound.

2. The polymer composite material for $^1$H dynamic nuclear polarization experiments according to claim 1,
    wherein a local concentration of the paramagnetic radical compound is substantially not position-dependent.

3. The polymer composite material for $^1$H dynamic nuclear polarization experiments according to claim 1, comprising substantially no molecular oxygen.

4. The polymer composite material for $^1$H dynamic nuclear polarization experiments according to claim 1,
    wherein a local concentration of the paramagnetic radical compound, which is defined by the following expression, is 15 to 35 mM:

(Local concentration of paramagnetic radical compound)=(Concentration of paramagnetic radical compound)/(1−(Volume fraction of filler)).

5. The polymer composite material for $^1$H dynamic nuclear polarization experiments according to claim 1, having a proton spin polarization, which is defined by the following expression, of 25% or more:

(Proton spin polarization)=(Number of up-spins Number of down-spins)/(Number of up-spins+ Number of down-spins).

6. The polymer composite material for $^1$H dynamic nuclear polarization experiments according to claim 1,
    wherein the polymer composite material is prepared by a production method comprising the step of diffusing a paramagnetic radical compound into a polymer composite material in the presence of an inert gas, a polymer composite material under vacuum, or a polymer composite material immersed in a solvent.

7. A method for producing the polymer composite material for $^1$H dynamic nuclear polarization experiments according to claim 1,
the method comprising the step of diffusing a paramagnetic radical compound into a polymer composite material in the presence of an inert gas, a polymer composite material under vacuum, or a polymer composite material immersed in a solvent.

* * * * *